United States Patent
Terada et al.

(10) Patent No.: US 9,240,221 B2
(45) Date of Patent: Jan. 19, 2016

(54) SEMICONDUCTOR MEMORY DEVICE WITH A SELECTION TRANSISTOR HAVING SAME SHAPE AND SIZE AS A MEMORY CELL TRANSISTOR

(71) Applicant: PANASONIC CORPORATION, Osaka (JP)

(72) Inventors: Yutaka Terada, Osaka (JP); Yasuhiro Agata, Osaka (JP); Wataru Abe, Osaka (JP); Masakazu Kurata, Osaka (JP); Kenji Misumi, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 24 days.

(21) Appl. No.: 14/080,694

(22) Filed: Nov. 14, 2013

(65) Prior Publication Data

US 2014/0071730 A1    Mar. 13, 2014

Related U.S. Application Data

(62) Division of application No. 12/243,299, filed on Oct. 1, 2008, now abandoned.

(30) Foreign Application Priority Data

Jan. 16, 2008    (JP) ................................ 2008-006805

(51) Int. Cl.
*G11C 5/06* (2006.01)
*G11C 7/18* (2006.01)
(Continued)

(52) U.S. Cl.
CPC *G11C 5/06* (2013.01); *G11C 5/063* (2013.01); *G11C 7/18* (2013.01); *H01L 27/0207* (2013.01); *H01L 27/112* (2013.01); *H01L 27/11253* (2013.01)

(58) Field of Classification Search
CPC ............ G11C 5/06; G11C 7/18; G11C 5/063; H01L 27/112; H01L 27/0207; H01L 27/11253
See application file for complete search history.

(56) References Cited

U.S. PATENT DOCUMENTS

| | | | |
|---|---|---|---|
| 5,051,952 A | 9/1991 | Gotou | |
| 5,267,208 A | 11/1993 | Asano | |
| 5,319,593 A * | 6/1994 | Wolstenholme | 365/185.05 |

(Continued)

FOREIGN PATENT DOCUMENTS

| | | |
|---|---|---|
| JP | 03-116488 A | 5/1991 |
| JP | 06-151781 A | 5/1994 |

(Continued)

OTHER PUBLICATIONS

Japanese Notice of Reasons for Rejection, with English Translation thereof, issued in Japanese Patent Application No. 2008-006805, mailed on Dec. 7, 2010.

(Continued)

*Primary Examiner* — J. H. Hur
(74) *Attorney, Agent, or Firm* — McDermott Will & Emery LLP

(57) ABSTRACT

A circuit on an end column of a divided memory array is formed by a block selection transistor having the same shape as that of a memory cell transistor. As the pattern of the connecting section between the main bit line and the sub-bit line is made in the same shape as that of the memory cell, it is possible to realize a pattern uniformity and to eliminate the need for using memory array dummy patterns.

10 Claims, 19 Drawing Sheets

(51) Int. Cl.
*H01L 27/02* (2006.01)
*H01L 27/112* (2006.01)

(56) References Cited

U.S. PATENT DOCUMENTS

| | | | |
|---|---|---|---|
| 5,327,378 A * | 7/1994 | Kazerounian | 365/185.16 |
| 5,396,098 A | 3/1995 | Kim et al. | |
| 5,554,867 A | 9/1996 | Ajika et al. | |
| 5,589,699 A | 12/1996 | Araki | |
| 5,659,513 A | 8/1997 | Hirose et al. | |
| 5,719,806 A * | 2/1998 | Yamane et al. | 365/185.16 |
| 5,818,761 A * | 10/1998 | Onakado | G11C 16/0416 |
| | | | 365/185.11 |
| 5,822,248 A * | 10/1998 | Satori | G11C 16/28 |
| | | | 365/185.11 |
| 5,852,570 A | 12/1998 | Hotta et al. | |
| 6,329,250 B1 | 12/2001 | Sakui | |
| 6,340,825 B1 | 1/2002 | Shibata et al. | |
| 6,385,088 B1 | 5/2002 | Arakawa et al. | |
| 6,433,384 B1 * | 8/2002 | Hashimoto | H01L 27/11521 |
| | | | 257/316 |
| 2002/0175349 A1 | 11/2002 | Morikawa | |
| 2003/0107092 A1 | 6/2003 | Chevallier | |
| 2003/0111732 A1 * | 6/2003 | Goda | H01L 21/76838 |
| | | | 257/758 |
| 2005/0162885 A1 | 7/2005 | Kanamitsu et al. | |
| 2006/0028855 A1 * | 2/2006 | Matsunaga | G11C 16/0483 |
| | | | 365/145 |
| 2006/0091447 A1 * | 5/2006 | Ema | H01L 27/105 |
| | | | 257/314 |
| 2006/0268653 A1 * | 11/2006 | Umezawa | G11C 8/10 |
| | | | 365/230.06 |
| 2006/0285380 A1 | 12/2006 | Cho et al. | |
| 2007/0030744 A1 | 2/2007 | Nakamura et al. | |
| 2007/0153618 A1 | 7/2007 | Fujito et al. | |
| 2007/0195591 A1 | 8/2007 | Cho et al. | |
| 2009/0180333 A1 * | 7/2009 | Yamada et al. | 365/185.29 |

FOREIGN PATENT DOCUMENTS

| | | |
|---|---|---|
| JP | 7-29373 A | 1/1995 |
| JP | 11-306776 A | 11/1999 |
| JP | 2000-260886 A | 9/2000 |
| JP | 2001-024070 A | 1/2001 |
| JP | 2001-085538 A | 3/2001 |
| JP | 2004-318941 A | 11/2004 |
| JP | 2005-175505 A | 6/2005 |
| JP | 2007-035663 A | 2/2007 |

OTHER PUBLICATIONS

Japanese Notice of Reasons for Rejection, w/English Translation thereof, issued in Japanese Patent Application No. JP 2008-006805 dated May 25, 2010.
Non-Final Office Action issued in U.S. Appl. No. 12/243,299, filed Jun. 9, 2011.
Final Office Action issued in U.S. Appl. No. 12/243,299, filed Nov. 8, 2011.
Non-Final Office Action issued in U.S. Appl. No. 12/243,299, filed Mar. 4, 2013.
Final Office Action issued in U.S. Appl. No. 12/243,299, filed Aug. 20, 2013.

* cited by examiner

SEMICONDUCTOR MEMORY DEVICE WITH A SELECTION TRANSISTOR HAVING SAME SHAPE AND SIZE AS A MEMORY CELL TRANSISTOR

RELATED APPLICATIONS

This application is a Divisional Application of U.S. application Ser. No. 12/243,299, filed Oct. 1, 2008, which claims the benefit of Japanese Application No. 2008-006805, filed on Jan. 16, 2008, the disclosures of which Applications are incorporated by reference herein.

BACKGROUND OF THE INVENTION

1. Field of the Invention

The present invention relates to a semiconductor memory device including a plurality of memory arrays. More particularly, the present invention relates to a hierarchical bit line architecture in which a plurality of sub-bit lines are connected to one main bit line.

2. Description of the Background Art

Various types of semiconductor memory devices, such as DRAMs (dynamic random access memories), SRAMs (static random access memories) and ROMs (read-only memories), are used in various applications, but they share some common internal configurations. Main components of a semiconductor memory device include a memory array portion being a storage portion including a plurality of memory cells arranged in a regular pattern, and a peripheral portion provided around the memory array portion and including control circuits such as a row decoder and an amplifier.

One factor that dictates the overall performance of a semiconductor memory device is its memory capacity (the number of memory cells), and it is an object of research and development to make as many memory cells as possible per unit area. Generally, there are two possible approaches to this object. One is to reduce the size of a memory cell itself, and the other is to reduce the size of a non-memory cell portion such as a peripheral circuit.

The memory cell size has been reduced to the limit by using state-of-the-art processes and custom-designed mask patterns. The size of the non-memory cell portion has also been reduced by reducing the circuits, for example. With state-of-the-art processes, the area of the memory cell portion has been reduced to the limit, resulting in a side effect being an influence from neighboring patterns such as the loading effect. Therefore, it is necessary to give some considerations not only for memory cells themselves but also for neighboring patterns.

In a memory array including a plurality of memory cells arranged in a matrix pattern, a central memory cell located in a central portion of the memory array is surrounded by memory cells of the same shape. Therefore, there is a uniform influence of, for example, pattern reflections from surrounding cells during lithography, thus enabling a stable formation of patterns. However, a peripheral memory cell located in a peripheral portion of a memory array is surrounded by memory cell patterns and other circuits. Since the layout pattern of a memory cell is different from those of other circuits, peripheral memory cells are subject to non-uniform influence from the surroundings. Therefore, the resulting pattern of a peripheral memory cell will be different from that of a central memory cell, thus resulting in variations between these memory cells in terms of memory cell transistor characteristics such as the transistor size and the threshold value. The performance of a semiconductor memory device is very much dependent on the memory cell characteristics, and variations among memory cells directly affect the performance of the semiconductor memory device. Depending on the amount of variations, the performance of the semiconductor memory device is deteriorated significantly. In view of this, dummy patterns having the same shape as memory cells are provided in the memory array peripheral portion for stabilizing the pattern formation.

U.S. Pat. No. 5,267,208 discloses an example of a memory (SRAM), which is divided into sections by wiring regions, thereby resulting in non-uniform patterns, wherein a dummy pattern is provided in the non-uniform portion (under the wiring region).

SUMMARY OF THE INVENTION

In recent years, there are strong demands for higher speeds, and in order to meet such demands, a semiconductor memory device now often employs a hierarchical architecture in which a memory array is divided into sections so as to reduce the load on the circuit. Particularly, division in the bit line direction is effective in realizing a higher speed and a stable operation. However, this trend has resulted in an increase in the number of sections into which a memory array is divided, and thus an increase in the total number of peripheral memory cells and the total amount of dummy pattern to be formed.

U.S. Pat. No. 5,267,208 only addresses a pattern non-uniformity caused by wiring. Moreover, the inserted pattern is a dummy pattern that is not used as a functional circuit portion. Furthermore, this patent fails to disclose the use of a hierarchical architecture. Although the use of dummy patterns is effective in improving the pattern uniformity, the provision of any pattern that is not used as a functional circuit portion leads to an increase in the total area.

In order to solve the problems set forth above, the present invention provides a semiconductor memory device having a hierarchical bit line architecture, in which a memory array is divided into sections, wherein a connecting section that connects a sub-bit line connected to memory cells with a main bit line is formed by a pattern having the same shape as that of a memory cell.

Thus, it is possible to maintain a layout pattern uniformity between a memory cell and a connecting section and to reduce the total amount of dummy pattern that is not used as a functional circuit portion, thus significantly reducing the total area.

Since the present invention realizes a layout pattern uniformity across a semiconductor memory device, it is possible not only to reduce characteristics variations of peripheral memory cells but also to eliminate the need for dummy pattern cells. Thus, it is possible to realize both a reduction in the total area and an improvement in the production yield.

DETAILED DESCRIPTION OF THE INVENTION

Embodiment 1

Embodiment 1 will now be described with reference to FIGS. 1, 2A, 2B and 2C.

Particularly, the present embodiment is directed to a mask ROM among other types of semiconductor memory devices.

Figure 1:
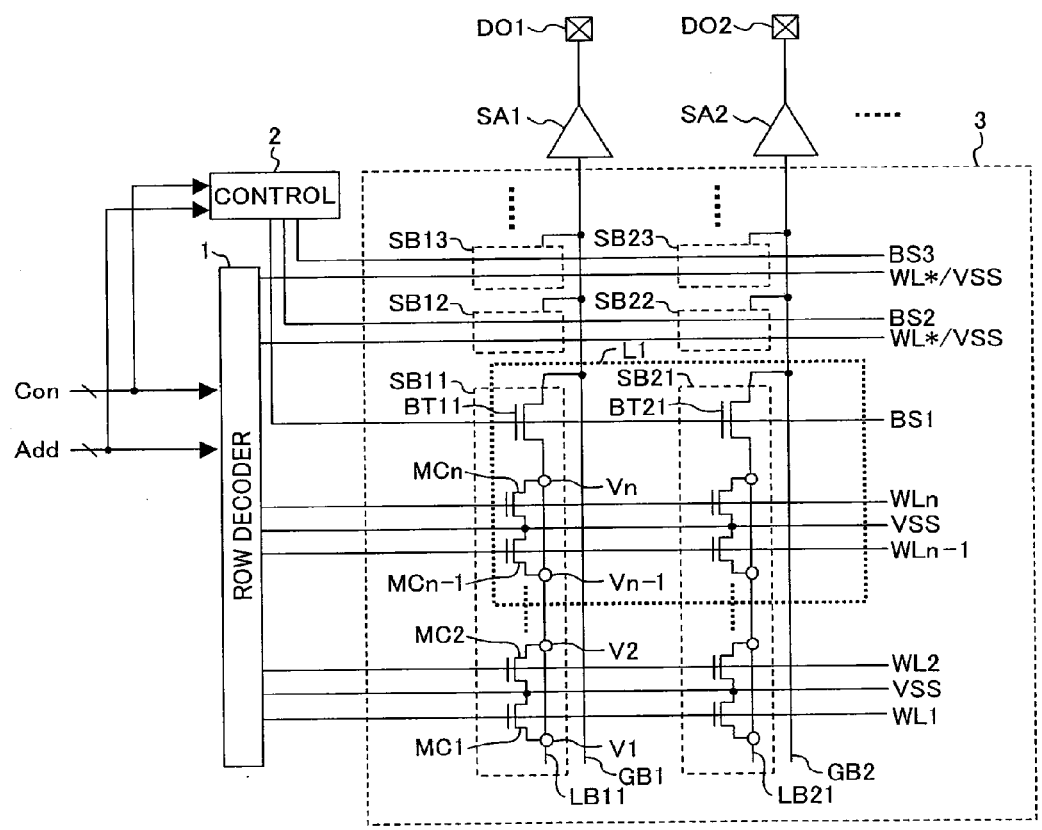
FIG. 1 is a circuit diagram showing a configuration of Embodiment 1.

FIG. 1 is a circuit diagram of the present embodiment, showing a portion of a NOR-type ROM circuit. A hierarchical bit line architecture is employed. In FIG. 1, 1 is a row decoder, 2 is a control section for generating a block selection signal, and 3 is a memory array. SA1 and SA2 are sense amplifiers, and DO1 and DO2 are output terminals. FIG. 1 shows only two output terminals DO1 and DO2 (and internal circuits associated therewith, such as the amplifiers). Other circuits, which are needed in order for the illustrated configuration to function as a ROM, are not shown in the figure as they are not directly related to the present invention.

Add and Con are an address signal and a control signal input to the ROM. MC1 to MCn are mask ROM memory cells, each including one NMOS transistor.

BT11 and BT21 are block selection transistors, each connecting a sub-bit line to a main bit line, and SB11, SB12, SB13, SB21, . . . are memory blocks into which the memory array 3 is divided, each including memory cells and a block selection transistor.

LB11 and LB21 are sub-bit lines to which the memory cells are connected. GB1 and GB2 are main bit lines, each being connected to a plurality of memory blocks via block selection transistors.

SA1 and SA2 are sense amplifiers for amplifying the potentials of the main bit lines GB1 and GB2 and outputting the amplified potentials to the output terminals DO1 and DO2, respectively.

WL* is a word line extending from the row decoder 1 and connected to the gates of memory cells for driving intended memory cells based on the input address Add.

BS* is a block selection signal line extending from the control section 2 and connected to the gates of block selection transistors for accessing an intended block also based on the input address Add.

A memory cell MC* has its source connected to the ground line (VSS) and its drain to a sub-bit line, and shares a common source line (ground line) with another memory cell adjacent thereto in the bit line direction. V1 to Vn each denote an intersection between a memory cell and a sub-bit line. The connection between each memory cell and a corresponding bit line is dictated by the presence/absence of a connection (i.e., the presence/absence of a contact layer) at this intersection, thus representing the ROM data (the program information).

While the following description is directed to the DO1 section, the same applies to the DO2 section, and so forth. Although a precharge circuit is needed for setting each of the main and sub-bit lines to an intended potential, the precharge circuit is not shown in the figure.

With the configuration of FIG. 1, one block selection signal line is driven based on the address Add and the control signal Con input to the row decoder 1 and the control section 2. Moreover, a word line corresponding to the block selection signal line is selected and brought to the H potential, thereby selecting a memory cell. Each sub-bit line is precharged in advance to the H potential (VDD). Therefore, if there is a connection at the intersection V* between the memory cell and the sub-bit line, the charge of the sub-bit line is drawn by the memory cell to VSS, and the potential of the sub-bit line lowers to L (it remains H if there is no connection). This information is output from the main bit line to the sense amplifier SA* and to the output terminal DO*, via the selected block selection transistor.

As opposed to the illustrated example, the bit line division is often not employed in the prior art, in which case a memory cell directly drives a bit line (corresponding to a main bit line in FIG. 1) being a long line. Thus, more memory cells are connected to each bit line, and there is a greater load capacitance which is driven by (from which charge is drawn by) a memory cell, thereby often requiring a greater amount of time for outputting data.

In contrast, the bit line division structure (hierarchical bit line architecture) as shown in FIG. 1 is capable of decreasing the capacitance driven by a memory cell, and the structure therefore is suitable for improving the operating speed.

Figure 2A:
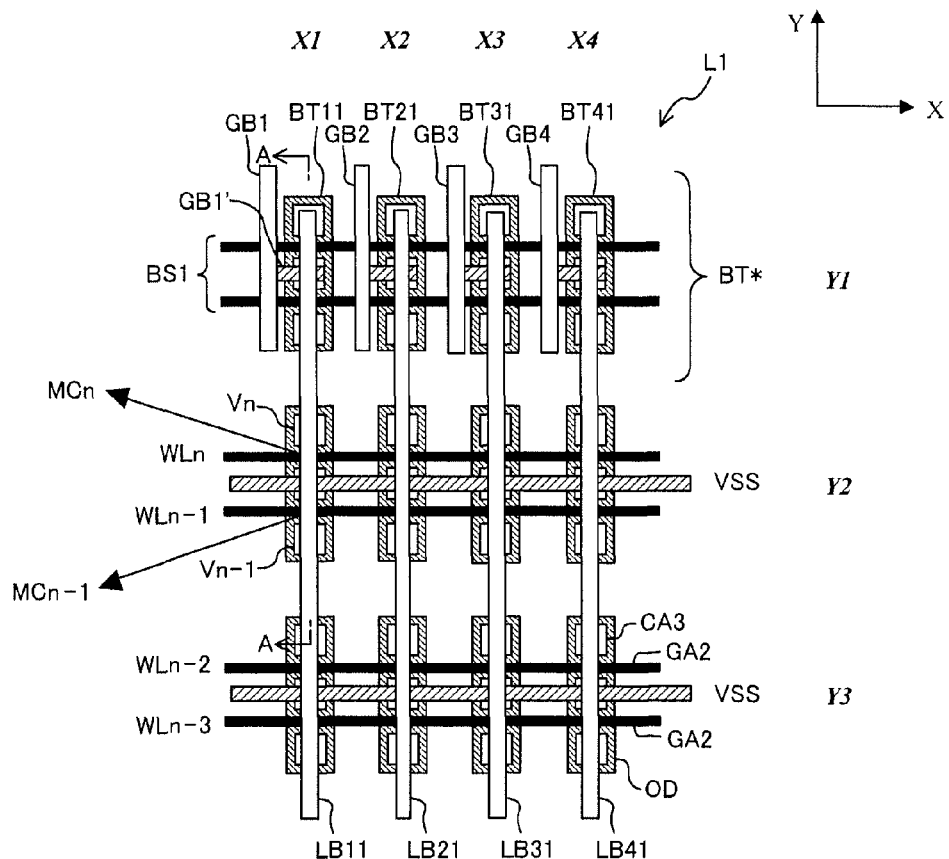
FIGS. 2A, 2B and 2C are layout diagrams and a cross-sectional view showing a configuration of Embodiment 1.

FIG. 2A is a layout diagram showing the L1 portion of FIG. 1, wherein the horizontal direction and the vertical direction in the figure are referred to as the X direction and the Y direction, respectively. In FIG. 2A, a number of activation regions OD of memory cells are arranged in a matrix pattern (4 in the X direction by 3 in the Y direction). Coordinates X1 to X4 and Y1 to Y3 are used to specify the position of each OD cell. In FIG. 2A, the X direction is the word line direction, and the Y direction is the bit line direction.

The memory cell columns X1, X2, . . . , correspond to SB11, SB21, . . . , of FIG. 1. X3 and X4 are memory cell columns corresponding to DO3 and DO4, which are not shown in FIG. 1.

Figure 2B:
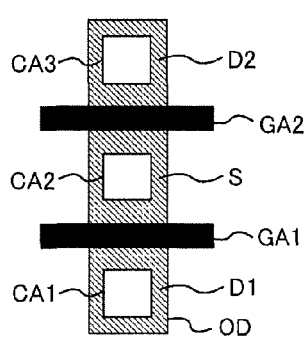

FIG. 2B shows an activation region OD in greater detail. The activation region OD is divided into three regions by two parallel gates GA1 and GA2 running over the activation region OD. The two gates GA1 and GA2 form two transistors. The three regions of each activation region OD include a central region S and two edge regions D1 and D2, and contacts on the regions D1, S and D2 are denoted as CA1, CA2 and CA3, respectively.

FIG. 2B shows a configuration where two gates run across each activation region OD, thereby forming two transistors for each activation region OD. FIG. 2A shows four cells (X1 to X4, accounting for a total of four transistors) in the X direction, and three cells (Y1 to Y3, accounting for a total of six transistors) in the Y direction.

The four activation regions OD in the Y1 row form block selection transistors, and the eight activation regions OD in the Y2 and Y3 rows form memory cells. The gates GA1 and GA2 running over the activation regions OD in the Y2 and Y3 are word lines of the memory cells, each extending in the X direction and being shared by a plurality of cells therealong. The VSS lines running over the activation regions OD in the Y2 and Y3 rows are formed as first-layer wires, and each VSS line is connected to memory cells via the contact CA2 as the source of each memory cell. Each of the VSS lines extends in the X direction and is shared by a plurality of cells.

The sub-bit lines LB11, LB21, LB31 and LB41 (LB31 and LB41 are not shown in FIG. 1) are second-layer wires extending above the VSS lines and perpendicular to the word lines. While the connection is controlled at the intersection V* in the memory cell section, the connection is made at the contacts CA1 and CA3 and then to the main bit line via the contact CA2 in the BT* section.

A sub-bit line and a main bit line are connected to each other by using, in parallel, two transistors in each activation region OD in the Y1 column.

Figure 2C:
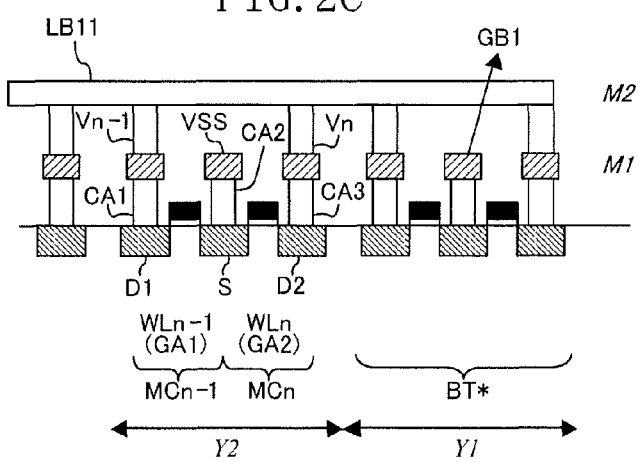

FIG. 2C is a cross-sectional view taken along line A-A (the area of the X1-Y1 and X1-Y2 cells) in FIG. 2A. The sub-bit line LB11 is connected to the memory cells MCn−1 and MCn via the contacts CA1 and CA3 in the Y2 section, and is connected to the block selection transistors BT* via the contacts CA1 and CA3 in the Y1 section. The two gates extending above the Y1 section are a common line BS1, and two transistors are connected together in parallel to thereby form the block selection transistor BT11. The contact CA2 in the Y1 section serves as the output of the block selection transistor BT11, and is connected to the main bit line GB1.

As shown in FIG. 2A, the main bit line GB1 extends in the same direction as the sub-bit line LB11 in the X1-Y1 cell. They may be formed in different layers, or may be formed in the same layer, in which case they are positioned so as not to overlap with each other. FIGS. 2A to 2C show a case where the main and sub-bit lines are both second-layer wires. In this case, the connection is made via a first-layer wire GB1' on the contact CA2.

As is clear from FIG. 2A, the memory cell section and the block selection transistor section share the same activation region shape and the same polarity (NMOS). Therefore, it is possible to form both memory arrays and connecting sections (between the sub-bit line and the main bit line) by only using memory cell patterns, thereby maintaining a pattern uniformity. As a result, it is possible to eliminate the need for providing, as a dummy region, a dummy memory cell pattern between memory cells and block selection transistors, such as that required in the prior art.

Since memory cells and connecting sections are both NMOS, it is also not necessary to provide a well isolation, which is required when PMOS is used, thereby providing an even greater effect in reducing the total area.

In the present embodiment, the memory cells and the connecting sections share the same shape not only with respect to the activation region OD but also to the gates GA and the contacts CA*, thereby providing an even greater effect in reducing transistor variations.

Variation 1 of Embodiment 1

Variation 1 of Embodiment 1 will now be described with reference to FIGS. 3 and 4.

Figure 3:
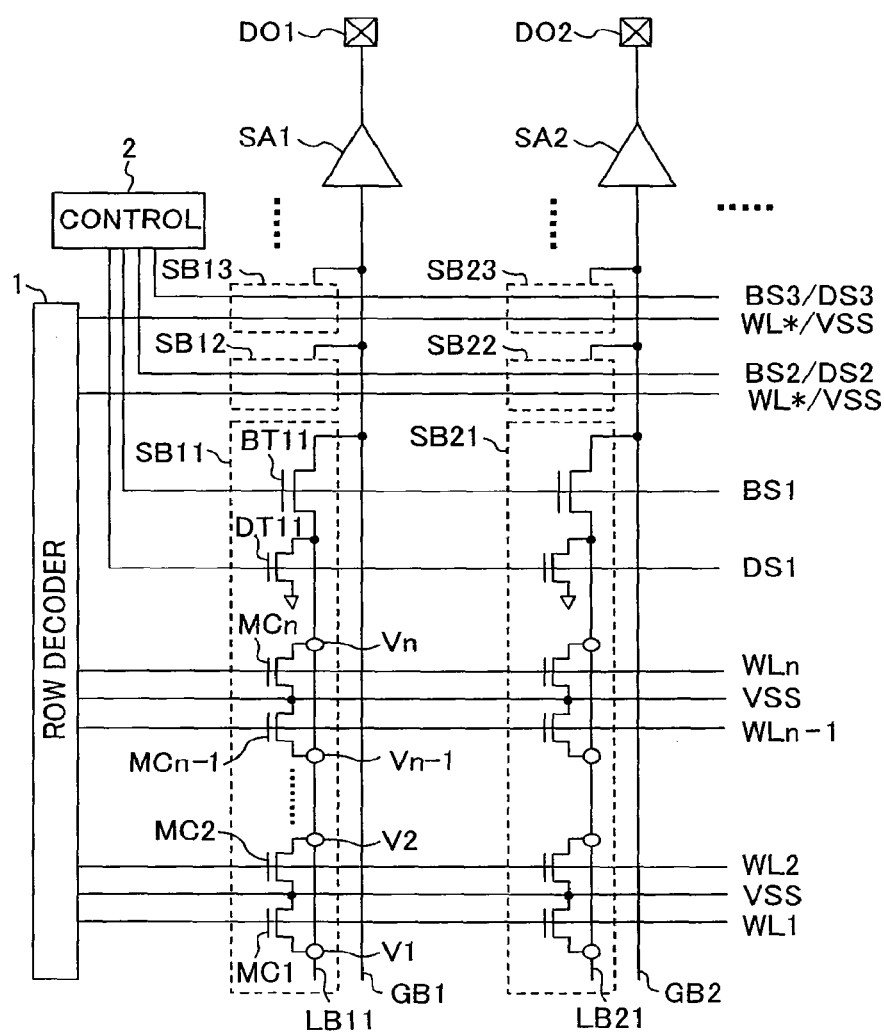
FIG. 3 is a circuit diagram showing a configuration of Variation 1 of Embodiment 1.
Figure 4:
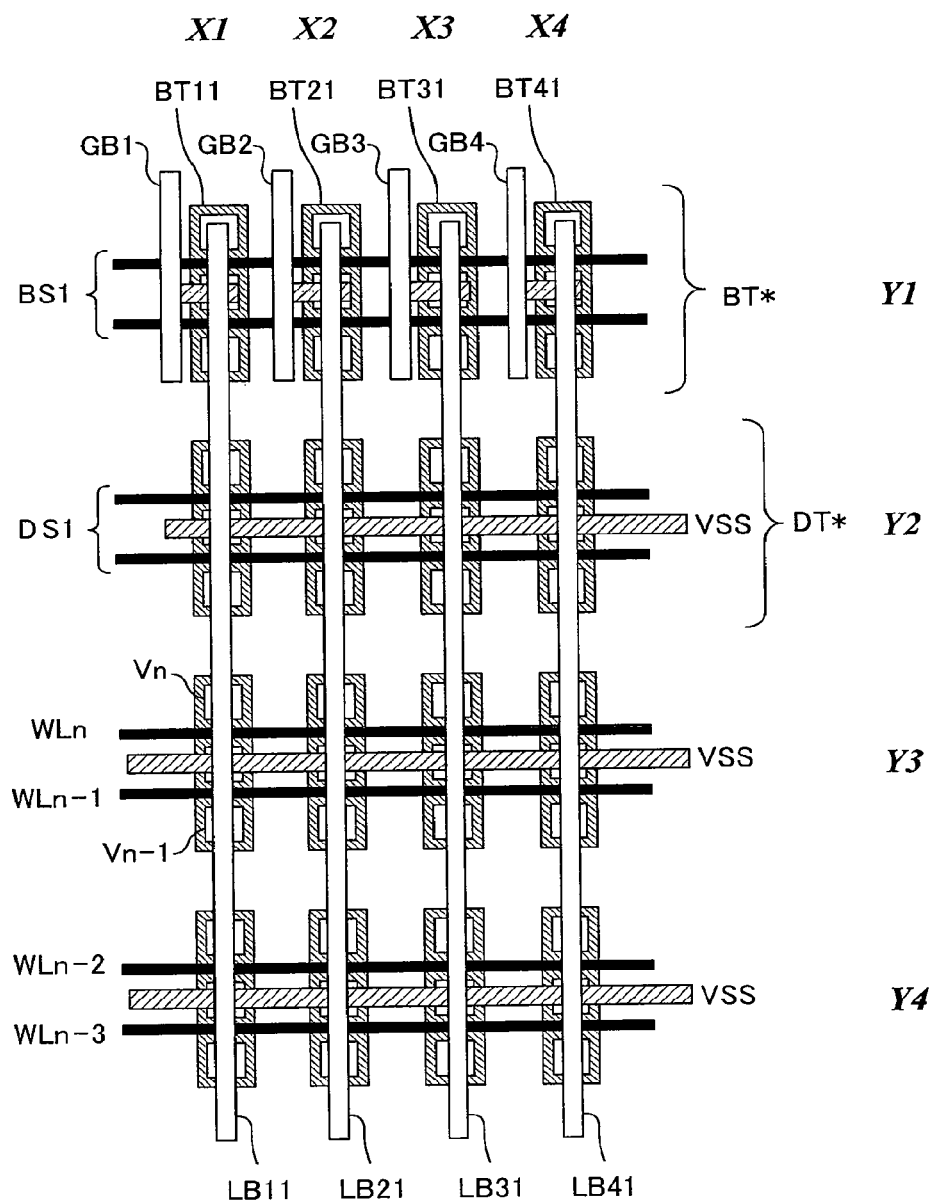
FIG. 4 is a layout diagram showing a configuration of Variation 1 of Embodiment 1.

FIG. 3 shows a configuration similar to that shown in the circuit diagram of FIG. 1, with an addition of a sub-bit line discharge transistor DT11. The sub-bit line discharge transistor DT11 is a transistor whose gate is connected to a signal line DS1 extending from the control section 2, whose source is connected to the ground, and whose drain is connected to the sub-bit line LB11. The sub-bit line discharge transistor DT11 is an NMOS transistor, as is a memory cell transistor. The discharge transistor DT11 is a switch for setting the sub-bit line to the ground potential based on the signal DS1, and serves to reset the sub-bit line after a read operation. FIG. 4 shows a layout diagram showing a configuration of Variation 1 of Embodiment 1. As compared with FIG. 2A, a row of activation regions OD extending in the Y direction is added as a DT section. The added row is denoted as DT* in the Y2 row in FIG. 4.

A discharge transistor DT* is connected to VSS via the contact CA2, as shown in FIG. 2C, and to a sub-bit line in parallel via two transistors at the contacts CA1 and CA3.

The discharge circuit added in the illustrated configuration can also be formed by the same shape as a memory cell transistor, as in Embodiment 1, whereby it is possible to eliminate the need for the dummy region.

Thus, not only the block selection transistor but also the discharge transistor can be formed by regions of the same shape as a memory cell transistor. This can similarly be applied to other types of circuits.

Also in the present variation, the memory cells and the connecting sections share the same shape not only with respect to the activation region OD but also to the gates GA and the contacts CA*, thereby providing an even greater effect in reducing transistor variations.

Variation 2 of Embodiment 1

Variation 2 of Embodiment 1 will now be described with reference to FIGS. 5A, 5B and 6.

Figures 5A, 5B:
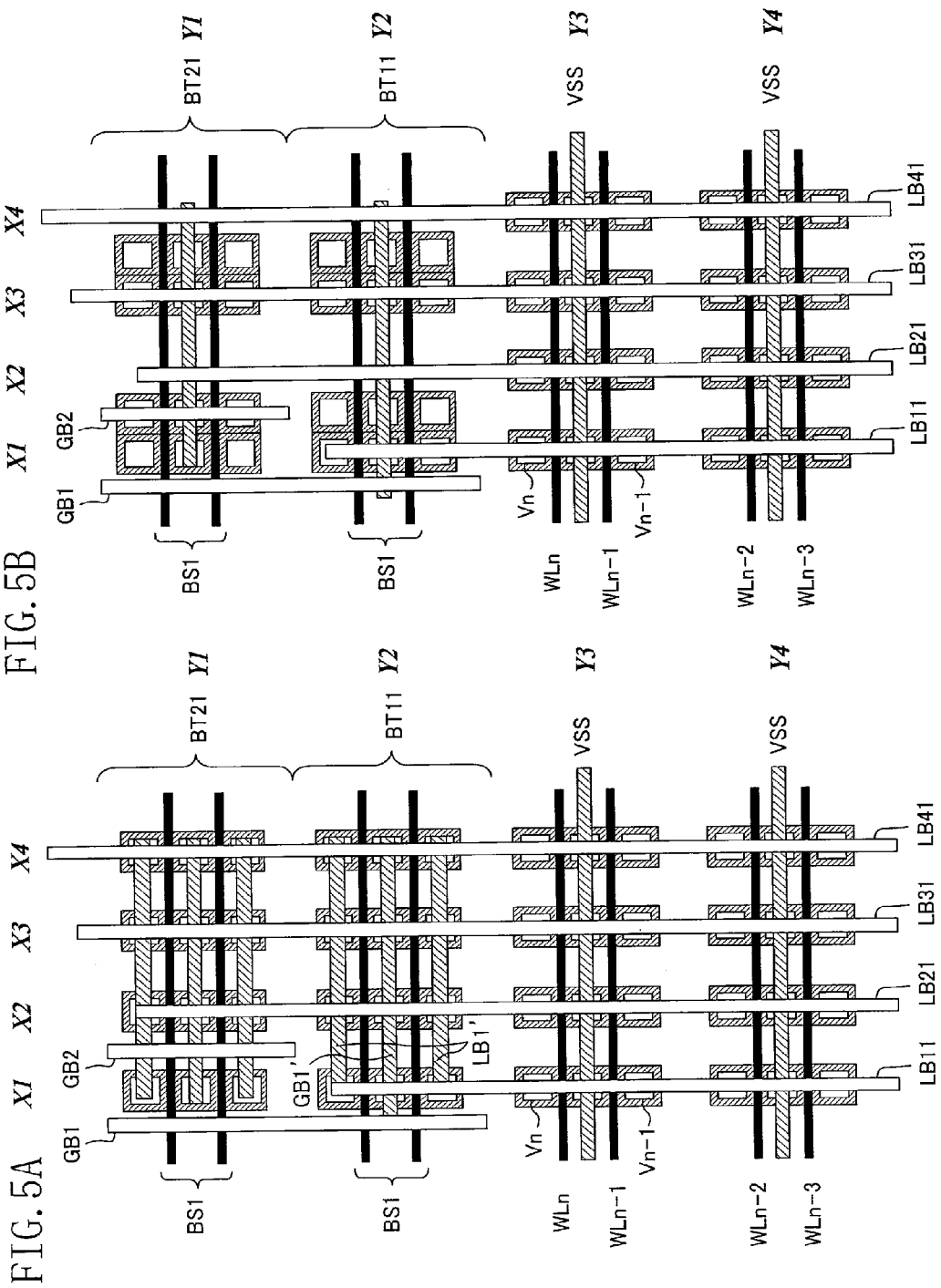
FIGS. 5A and 5B are layout diagrams showing a configuration of Variation 2 of Embodiment 1.

FIG. 5A is a layout diagram showing a variation of FIG. 2A, in which the size of the block selection transistor BT* is changed. The size change is made by providing a plurality of activation regions OD connected in parallel.

In FIG. 5A, the block selection transistor BT11 connected to the sub-bit line LB11 accounts for the four activation regions OD in the Y2 row. While the block selection transistor BT11 accounts for one activation region OD (i.e., two transistors therein) in FIG. 2A, it accounts for four activation regions OD in the illustrated example. Thus, there is a 4-fold increase in size.

The sub-bit line LB11 is connected in parallel to the regions D1 and D2 of four activation regions OD (eight transistors) of the block selection transistors BT11 in the Y2 row via first-layer wires LB1', and the main bit line GB1 is connected in parallel to the regions S of the block selection transistors BT11 in the Y2 row via a first-layer wire GB1'.

Due to the parallel use of four activation regions OD, the arrangement of block selection transistors differs between adjacent sub-bit lines. Specifically, the block selection transistor BT21 of the sub-bit line LB21 corresponds to the X2-Y1 cell in FIG. 2A, whereas it corresponds to the four activation regions OD in the Y1 row in FIG. 5A.

With the present configuration, the size of the block selection transistor can be changed in the same manner for any sub-bit lines, whereby it is possible to reduce the total area without lowering the memory characteristics. With the present configuration, it is possible to realize uniform OD, GA and CA patterns.

While each set includes four activation regions OD in FIG. 5A, the present invention is not limited to this, but the size can be varied by changing the number of regions to be arranged in parallel, for example.

FIG. 5B shows a configuration in which the transistor pitch in the BT section is changed so as to optimize the shape. Size changes can be accommodated in a flexible manner.

Figure 6:
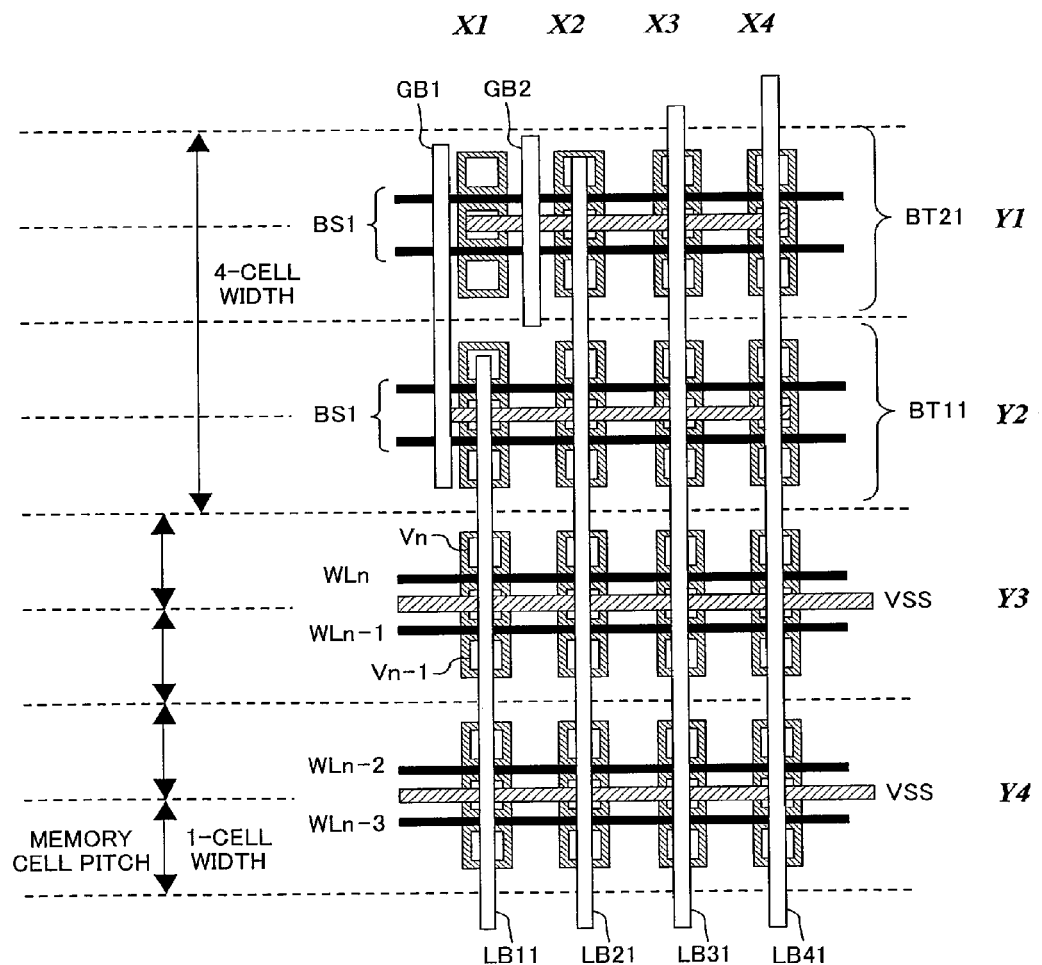
FIG. 6 is a layout diagram showing a configuration of Variation 2 of Embodiment 1.

FIG. 6 shows various transistor regions of FIG. 5A. The cell width is equal to one memory cell (one cell) in the memory cell regions in the Y3 and Y4 rows, whereas it is equal to four cells in the block selection transistor sections in the Y1 and Y2 columns since the BS signal is shared. As compared with a normal word line, there are a plurality of (four in the figure) BS signals in the BT section, and the BT section therefore has a greater load. Thus, the speed of the ROM operation can be improved by increasing the size of the word line driver in the row decoder 1 and that of the block selection signal driver in the control section 2 according to the cell size as described above.

Variation 3 of Embodiment 1

Variation 3 of Embodiment 1 will now be described with reference to FIG. 7.

Figure 7:
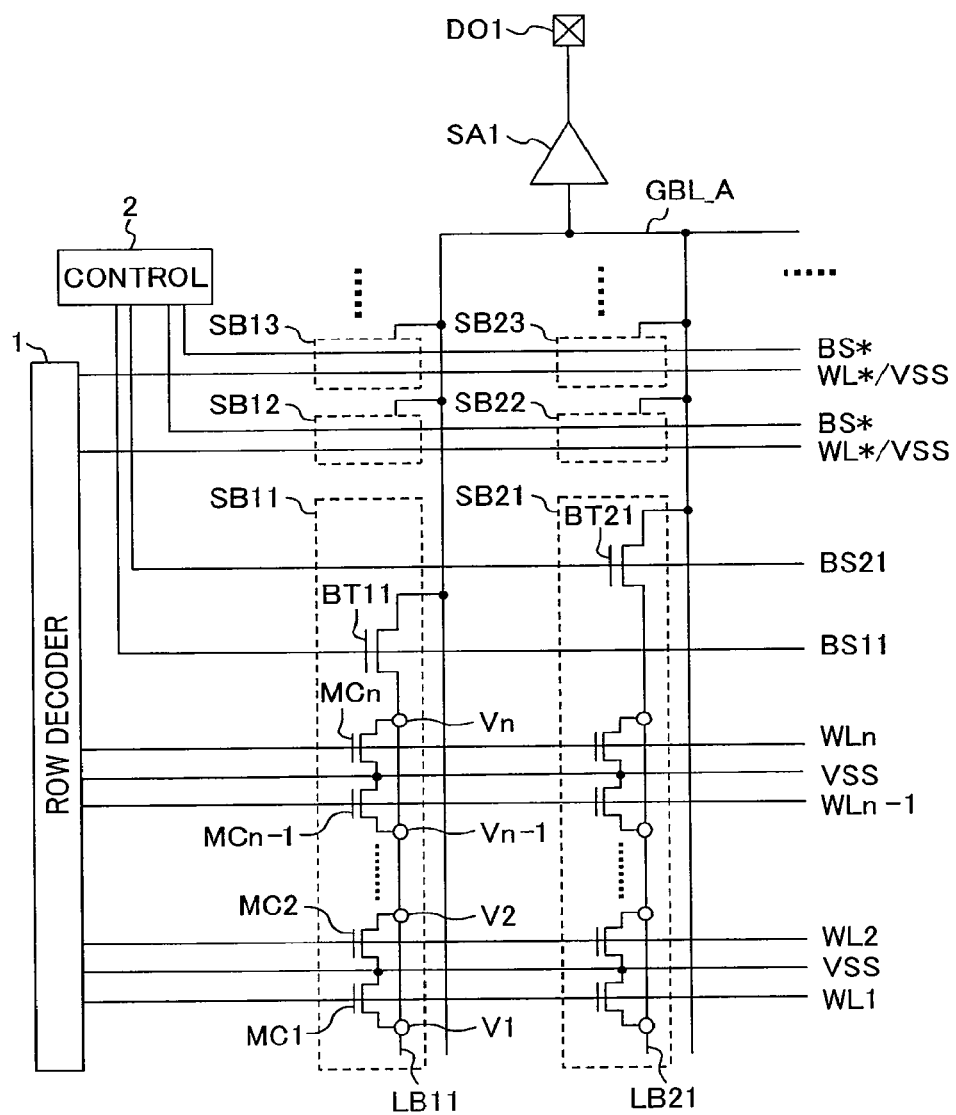
FIG. 7 is a circuit diagram showing a configuration of Variation 3 of Embodiment 1.

In FIG. 7, a single main bit line GBL_A is used instead of the plurality of main bit lines in FIG. 1. The connection is made to the single main bit line via the block selection transistors of the sub-bit lines. FIG. 7 only shows the output terminal DO1.

In FIG. 7, a plurality of block selection signals are used for simultaneously controlling the block selection transistors and selecting the main bit line in FIG. 1. Specifically, in FIG. 7, the block selection transistors BT11 and BT21 are controlled by separate signals BS11 and BS21. The number of block selection transistors to be controlled varies depending on the number of main bit lines to be put together into a shared main bit line.

The present configuration can be realized, based on the configuration shown in the layout diagram of FIG. 5A, by separately controlling the lines BS1 in the Y1 and Y2 columns and by connecting together the main bit lines GB1 and GB2.

Embodiment 2

Embodiment 2 will now be described with reference to FIGS. 8, 9A and 9B.

Figure 8:
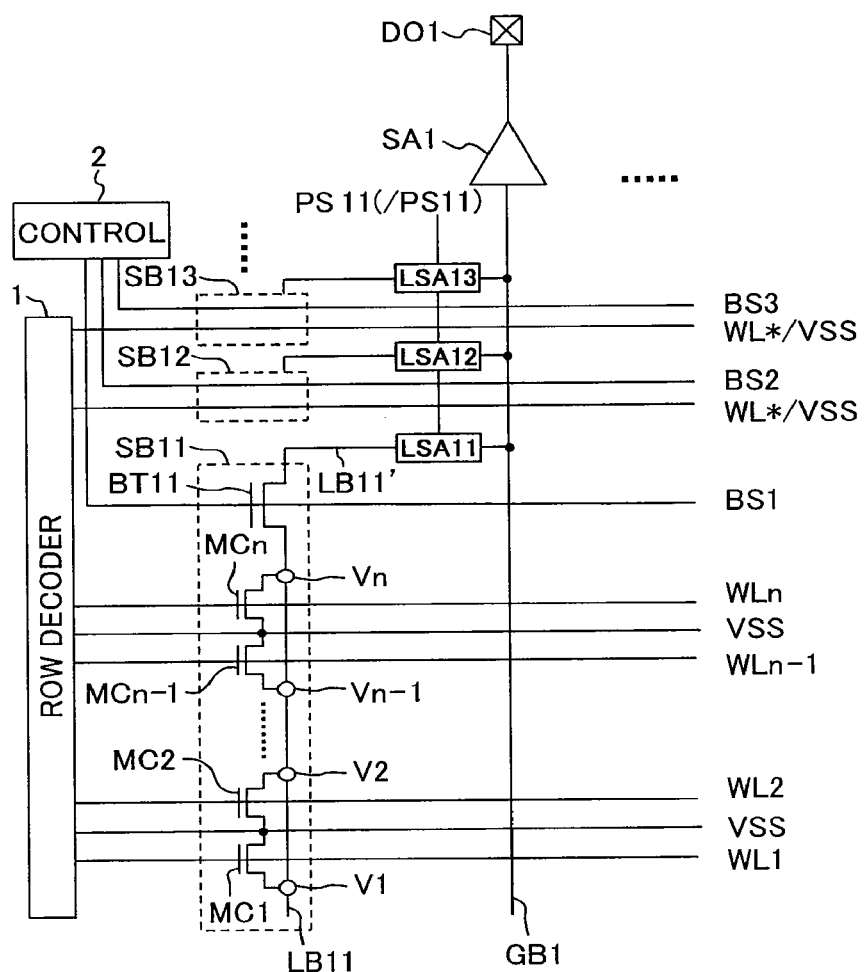
FIG. 8 is a circuit diagram showing a configuration of Embodiment 2.

FIG. 8 shows a configuration similar to that shown in FIG. 1, except that connecting circuits (local sense amplifiers) LSA* (LSA11, LSAl2, LSA13, . . . ) are added.

The local sense amplifier LSA* has an amplifier function of amplifying the potential of the sub-bit line and outputting the amplified potential to the main bit line, and a precharge function of setting the sub-bit line to an intended potential.

The local sense amplifier LSA* is provided between the block selection transistor BT11 and the main bit line GB1, and receives a control signal PS11 (or an inverted signal /PS11 thereof) from the control section 2 or another control circuit.

The internal configuration of the local sense amplifier LSA* will be described with reference to FIGS. 9A and 9B, with respect particularly to the sub-block SB11. The following description similarly applies to other sub-blocks. Herein, the signal between the block selection transistor BT11 and the local sense amplifier LSA11 is denoted as LB11'.

Figure 9A:
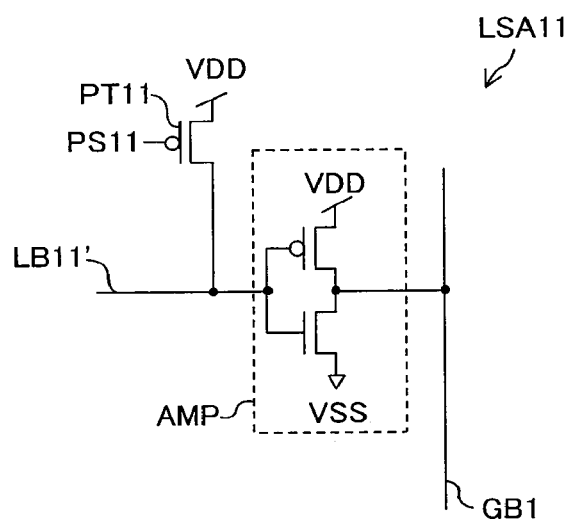
FIGS. 9A and 9B are circuit diagrams showing a configuration of Embodiment 2.

In FIG. 9A, PT11 is a precharge transistor being a PMOS transistor whose source is connected to VDD, whose drain is connected to the signal LB11', and whose gate is connected to the control signal PS11. An amplifier AMP has an inverter configuration including a PMOS transistor and an NMOS transistor.

As the control signal PS11 goes to L, the signal line LB11' is set (precharged) to VDD (H potential). After releasing the precharge, the memory starts a read operation, whereby the signal line LB11' transitions (stays H when the data is H, and goes to L when the data is L). Receiving the potential of the signal line LB11', the amplifier AMP amplifies the potential and outputs the amplified potential to the main bit line GB1.

With the configurations described above and shown in FIGS. 1 to 8, a memory cell accesses not only the sub-bit line but also the main bit line via the block selection transistor. With the present configuration, the main bit line is driven by the amplifier AMP, thereby reducing the load on a memory cell, thus realizing a faster operation.

Figure 9B:
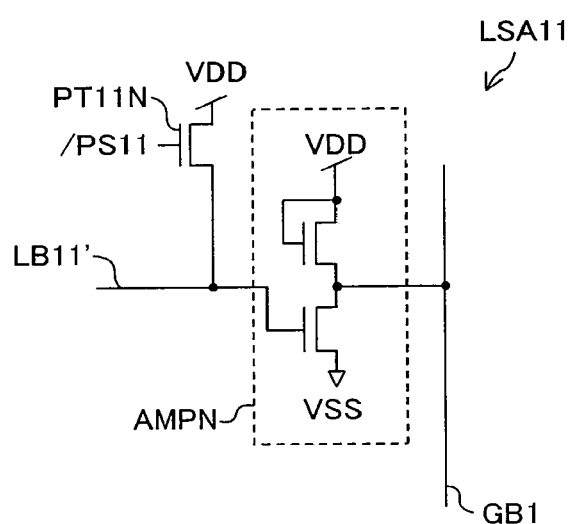

FIG. 9B is a variation of FIG. 9A. A precharge transistor PT11N and an amplifier AMPN are both NMOS transistors. Thus, transistors of the same polarity as the memory cells can be used, whereby it is possible to eliminate the need for a well region for PMOS in the memory array, thus reducing the total area.

Variation 1 of Embodiment 2

Variation 1 of Embodiment 2 will now be described with reference to FIGS. 10, 11A, 11B and 12.

Figure 10:
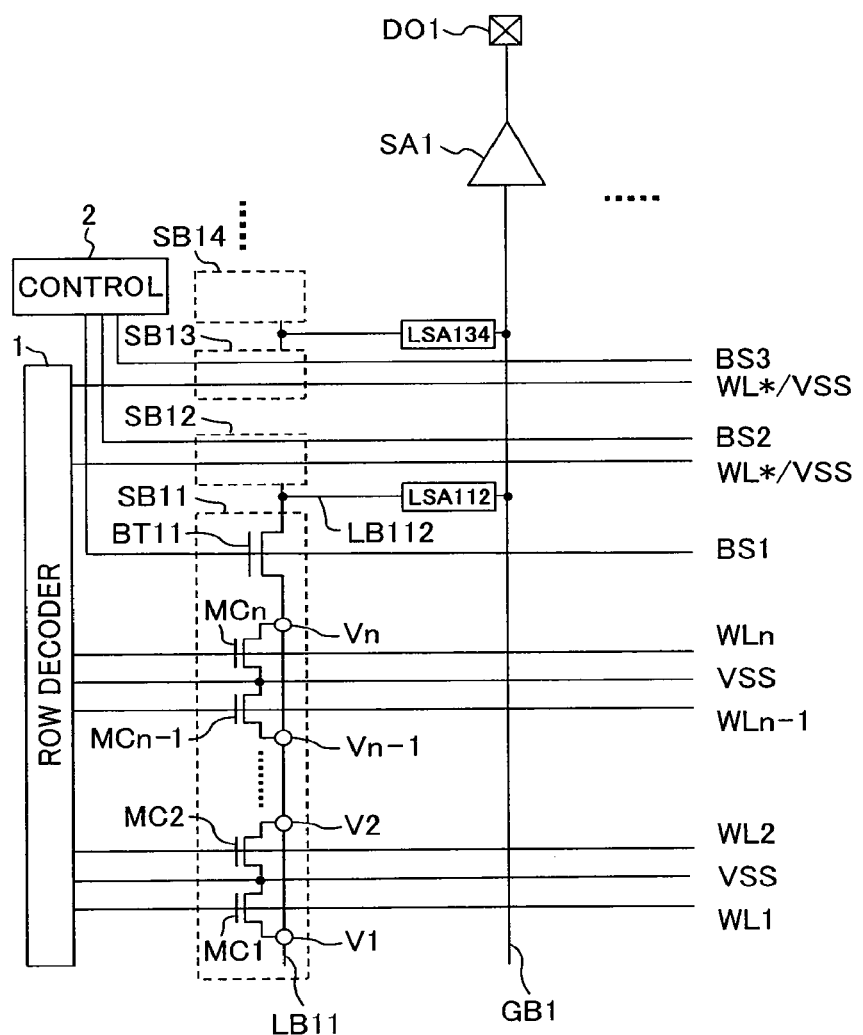
FIG. 10 is a circuit diagram showing a configuration of Variation 1 of Embodiment 2.
Figure 11A:
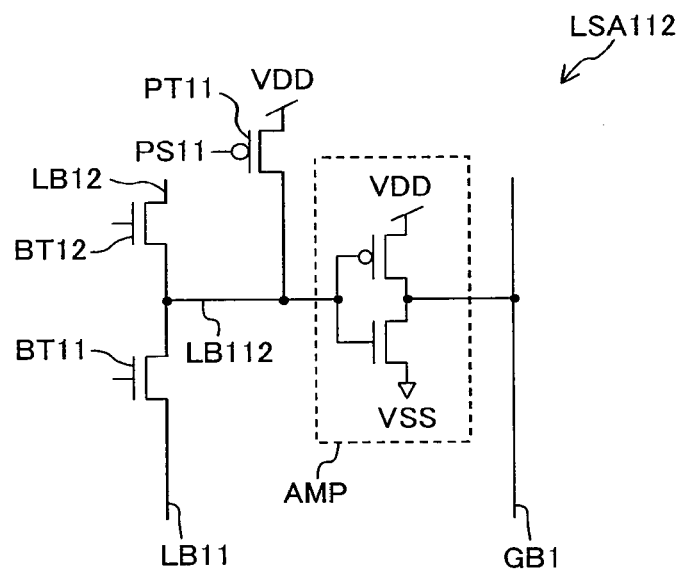
FIGS. 11A and 11B are circuit diagrams showing a configuration of Variation 1 of Embodiment 2.
Figure 11B:
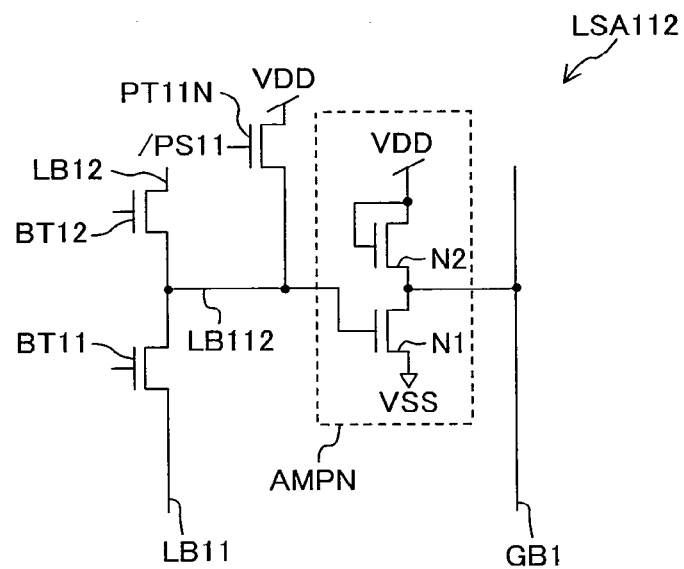

FIG. 10 shows a configuration where the amplifier/precharge circuit as described above is shared by the sub-blocks SB11 and SB12 (a local sense amplifier LSA112). FIGS. 11A and 11B show the local sense amplifier LSA112 and the block selection transistors BT11 and BT12 of FIG. 10.

In FIG. 11A, two sub-bit lines are connected to an amplifier input signal line LB112 via the block selection transistors BT11 and BT12, respectively. Since the precharge transistor PT11 and the amplifier AMP are shared by the upper and lower sub-blocks SB11 and SB12, there is provided a significant effect in reducing the total area. FIG. 11B shows a variation of FIG. 11A.

Figure 12:
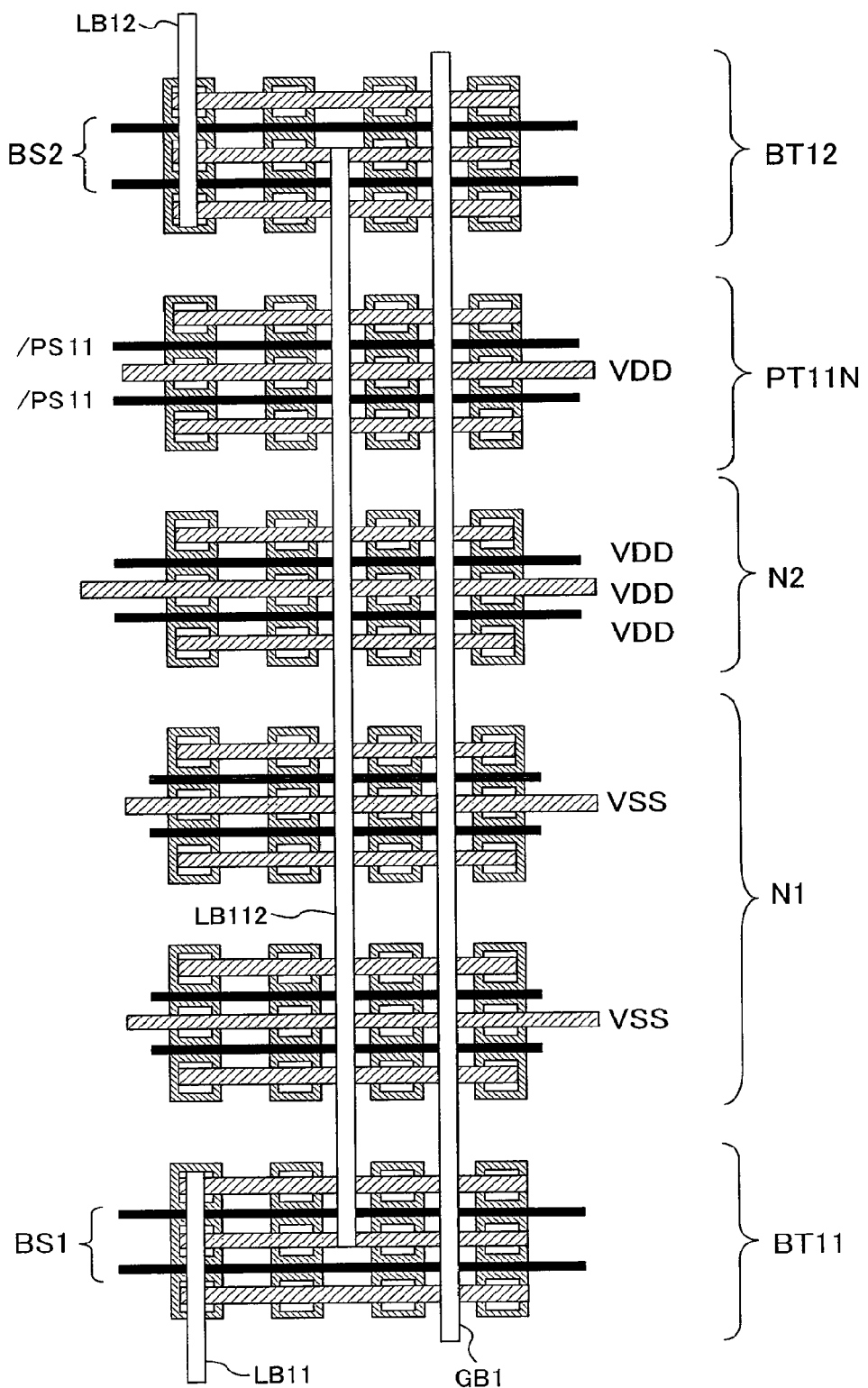
FIG. 12 is a layout diagram showing a configuration of Variation 1 of Embodiment 2.

FIG. 12 is a layout diagram showing a circuit configuration of FIG. 11B. As shown in FIG. 12, the sub-bit lines LB11 and LB12 come from the lower side and from the upper side, respectively, and are connected in parallel to the four activation regions OD (eight transistors) of the block selection transistors BT11 and BT12, respectively, via the regions D1 and D2, with the region S of each activation region OD being connected to the amplifier input signal line LB112.

The amplifier input signal line LB112 is connected to the regions D1 and D2 of the precharge transistor PT11N (where the four activation regions OD are connected in parallel, the region S is connected to VDD, and the gates are both /PS11), and to the four gates of a transistor section N1. The regions D1 and D2 of the transistor section N1 are connected to the main bit line GB1. The regions D1 and D2 of a transistor section N2 are connected to the main bit line GB1, the region S thereof is connected to VDD. The transistor section N1 uses twice as many cells as other transistor sections so as to improve the access speed of the main bit line GB1, but the number of cells is not limited to this.

Variation 2 of Embodiment 2

Figure 13A:
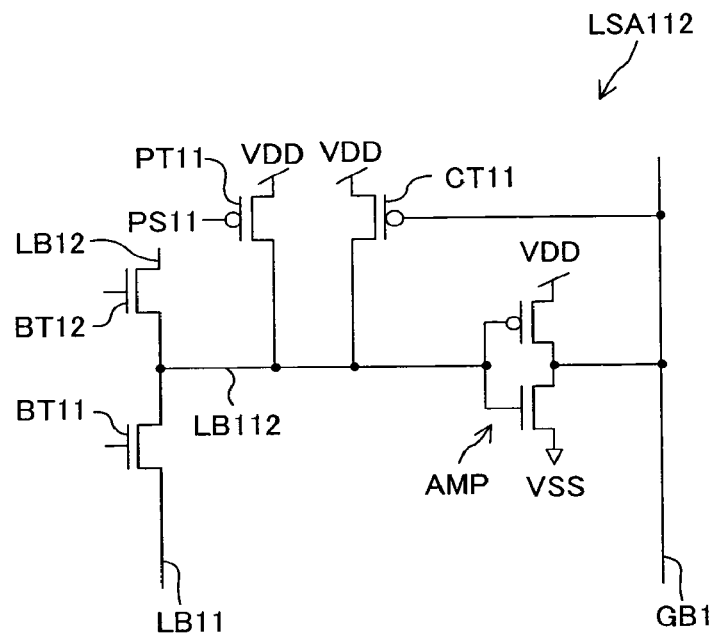
FIGS. 13A and 13B are circuit diagrams showing a configuration of Variation 2 of Embodiment 2.
Figure 13B:
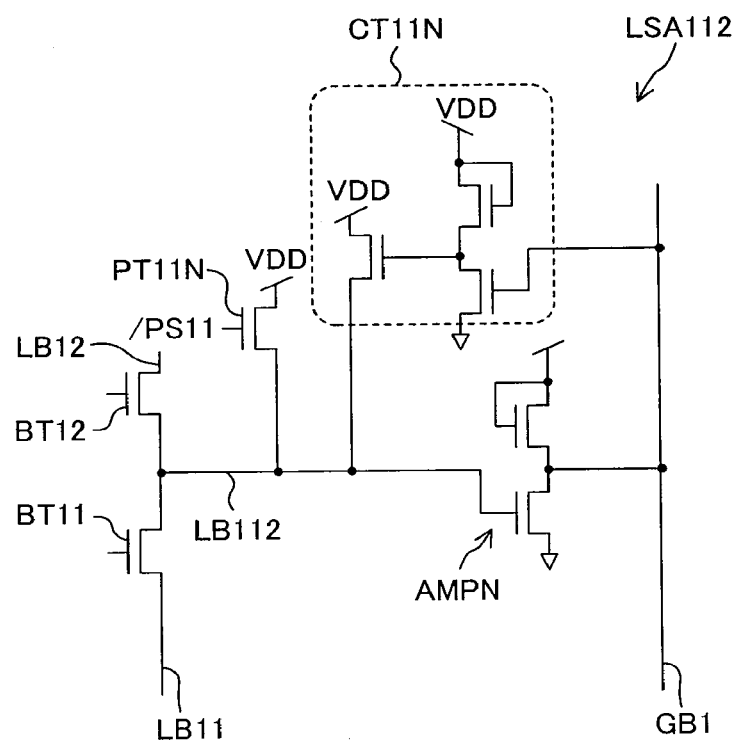

FIGS. 13A and 13B show a variation of the local sense amplifier LSA112 of FIG. 10. FIG. 13A shows a configuration where a circuit CT11 is added. The circuit CT11 is a circuit for reinforcing the H potential of the signal line LB112, and is provided for the purpose of preventing the H potential from lowering due to the OFF leak current of the memory cell when the sub-bit lines LB11 and LB112 are H.

The circuit CT11 includes a PMOS transistor whose source is connected to VDD, whose drain is connected to the signal line LB112, and whose gate is connected to the main bit line GB1.

When the main bit line GB1 is L, i.e., when the signal line LB112 is H, the circuit CT11 is ON, thereby connecting the signal line LB112 with VDD.

FIG. 13B shows a case where a circuit CT11N only includes NMOS transistors. Similar effects to those of FIG. 13A are obtained.

Embodiment 3

Embodiment 3 will now be described with reference to FIGS. 14A, 14B and 14C.

Figure 14A:
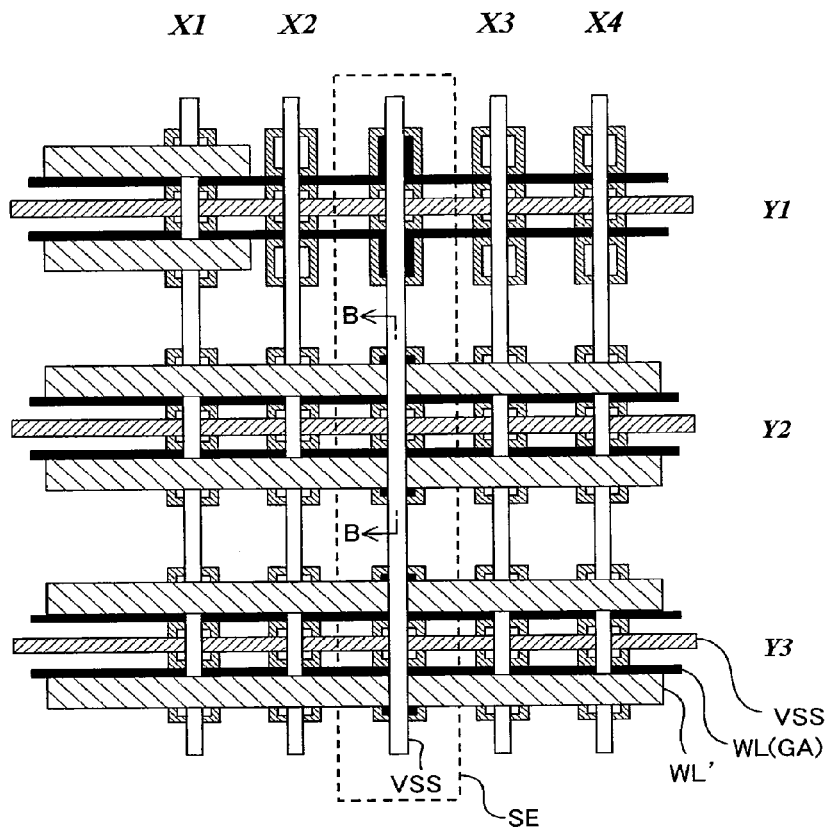
FIGS. 14A, 14B and 14C are layout diagrams and a cross-sectional view showing a configuration of Embodiment 3.
Figure 14B:
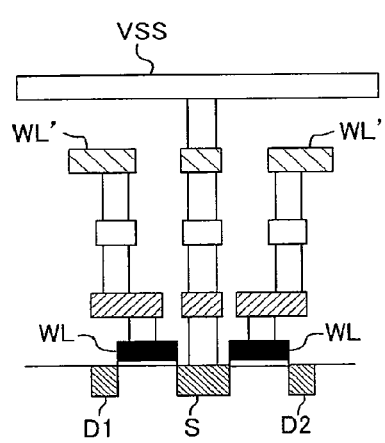
Figure 14C:
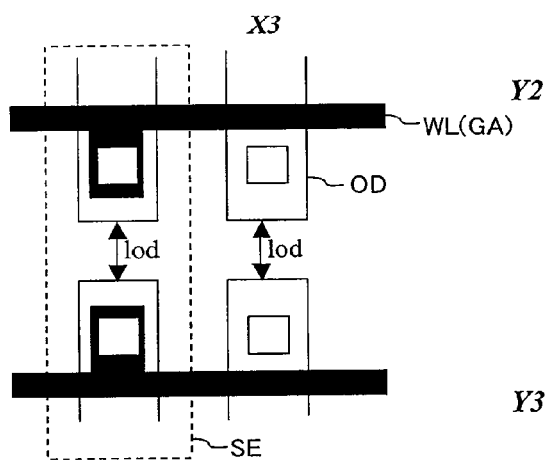

FIGS. 14A to 14C show the pattern uniformity between the word line backing section, the substrate potential connecting section and the power supply wiring region. A memory array conventionally includes a word line backing section, a substrate potential connecting section and a power supply wiring region. Memory cells are not provided in these sections, whereby the pattern non-uniformity is likely to occur between these sections. The present invention addresses the pattern non-uniformity in these sections.

FIG. 14A is a layout diagram showing these sections, and FIG. 14B is a cross-sectional view taken along line B-B of FIG. 14A. FIG. 14C is an enlarged view of the area (SE-X3, Y2-Y3) of FIG. 14A. The upper-layer wire is omitted in FIG. 14C.

The OD sections in the X1 to X4 columns are memory cells, and the SE section in FIG. 14A denotes a connecting section as described above.

In the SE section, backing is provided on the word line being the gate GA, the substrate potential of the NMOS memory cell is supplied, and the power supply wiring (VSS) is provided (where M1 is the first-layer wire, M2 is the second-layer wire, M3 is the third-layer wire, and M4 is the fourth-layer wire).

In the memory configurations described above, the memory cell gates are word lines WL and are connected (shared) in the same word line direction, but a gate is often a high-resistance line of polysilicon, or the like. Therefore, as the wiring length increases, there is a characteristics deterioration due to delay. In view of this, a backing connection is made in an upper-layer wire WL' having a lower resistance. In the configuration of FIG. 14B, this wire is provided by using the third-layer wire in the SE section.

By providing an OD pattern similar to a memory cell pattern under the backing section, it is possible to maintain a pattern uniformity between adjacent memory cells.

However, since the wiring width of a gate GA is small, it is in some cases difficult to provide a backing contact thereon. Therefore, the gate GA is widened in the activation region OD in the SE section so as not to extend beyond the activation region OD to ensure a sufficient contact area for allowing the provision of the backing contact (see FIGS. 14B and 14C).

Since the distance between adjacent activation regions OD is equal (lod) in the SE section and in the memory cell section, the influence from adjacent cells can be made uniform.

Moreover, in the SE section, the ground line (VSS), which in the prior art extends in the same direction as word lines, is provided in the fourth-layer wire so as to extend in a direction crossing word lines.

Moreover, as the region S of the activation region OD in the SE section is provided as a P-type region, which is reverse to the polarity of the source/drain region of the memory cell section, the connection with the substrate is made possible, thus reinforcing the substrate potential.

Embodiment 4

Embodiment 4 will now be described with reference to FIGS. 15 and 16.

Figure 15:
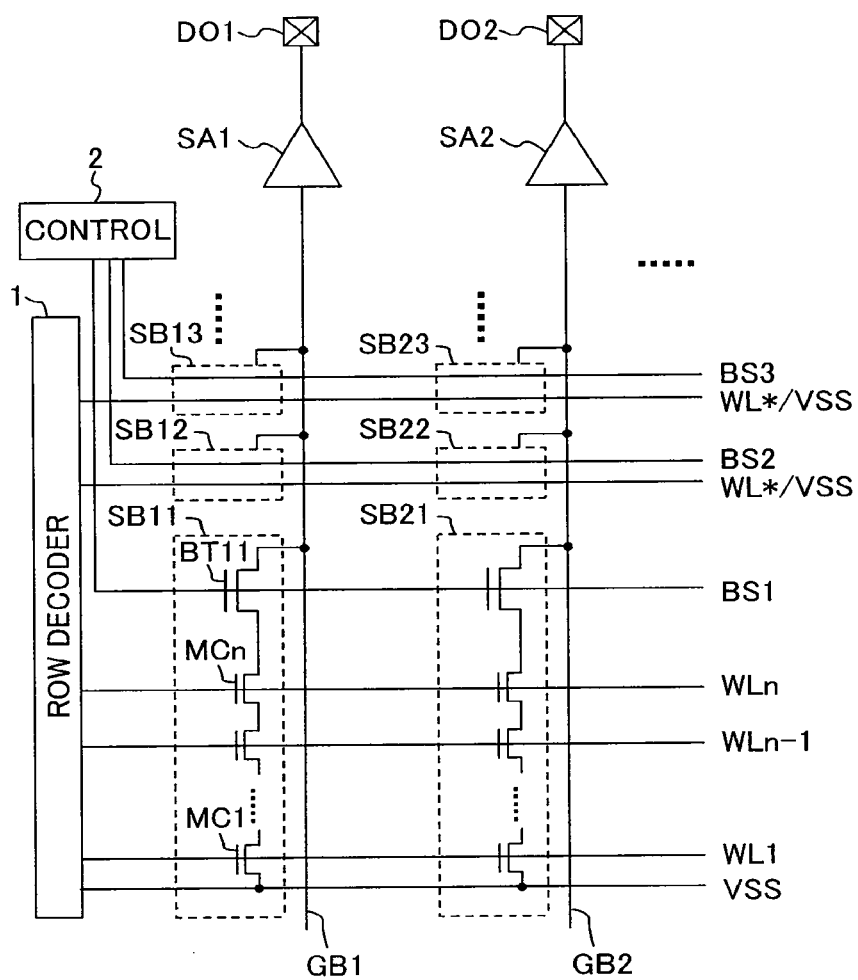
FIG. 15 is a circuit diagram showing a configuration of Embodiment 4.

FIG. 15 shows a configuration where memory cells connected to the same sub-bit line together form a NAND structure. A NAND structure is a structure where memory cells each accounting for a bit are connected in series. Although such a serial connection results in a decrease in the cell current, it eliminates the need for separating memory cells from each other. As a result, the inter-cell distance is reduced, thus providing a significant area-reducing effect.

In FIG. 15, MCn to MC1 are memory cells, BT11 is a block selection transistor, SB11 (SB12, SB13, . . . ) is a memory block including the memory cells MCn to MC1 and the block selection transistor BT11 connected in series, with one end of the memory cell MCn being connected to the main bit line via the block selection transistor BT*, and one end of the memory cell MC1 being connected to the ground line (VSS).

Figure 16:
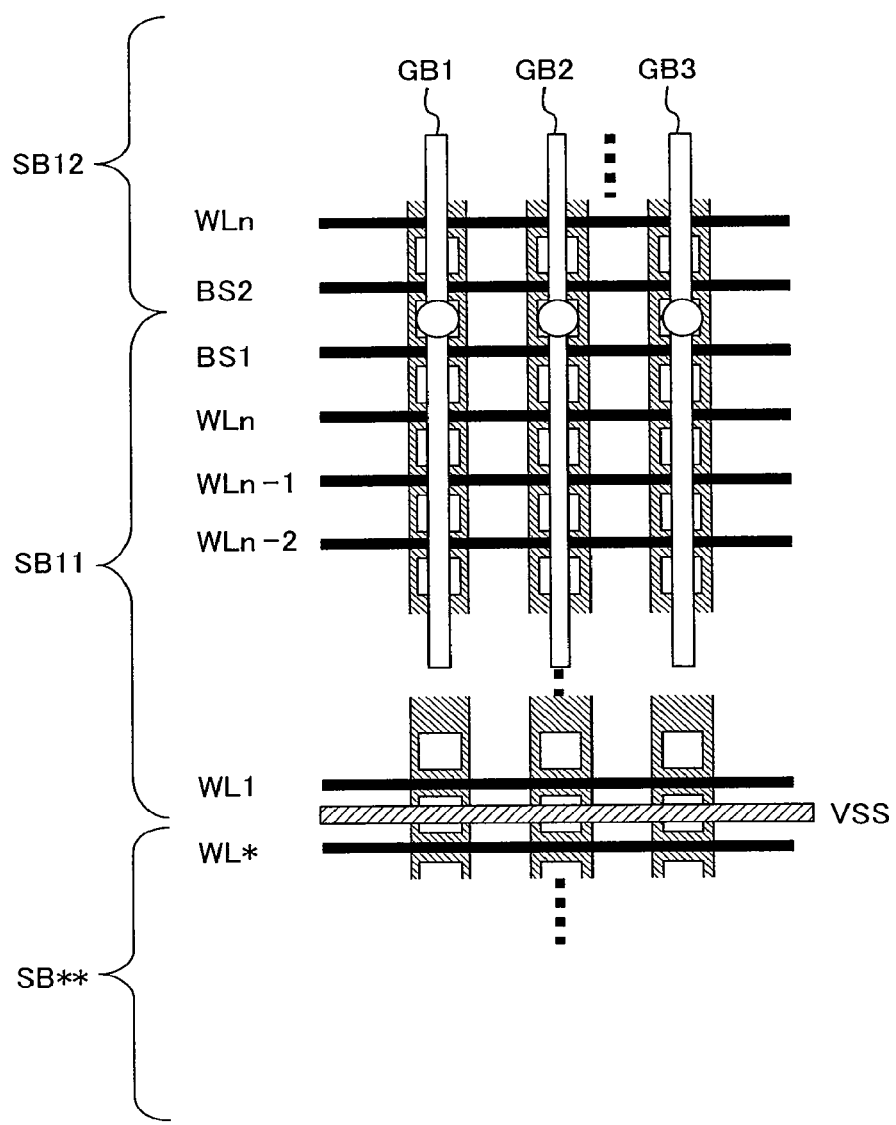
FIG. 16 is a layout diagram showing a configuration of Embodiment 4.

FIG. 16 is a layout diagram of such a circuit. The connection with the main bit line is made between the memory blocks SB11 and SB12. The configuration of this layout diagram uses a shared output (the connecting section with the main bit line) between the memory blocks SB11 and SB12, thus providing a greater area-reducing effect.

Moreover, the connection with the VSS (ground line) being on the opposite side from the connecting point with the main bit line can also be shared between opposing memory blocks SB**, thereby reducing the area.

Embodiment 5

Embodiment 5 will now be described with reference to FIGS. 17, 18, 19A and 19B.

Figure 17:
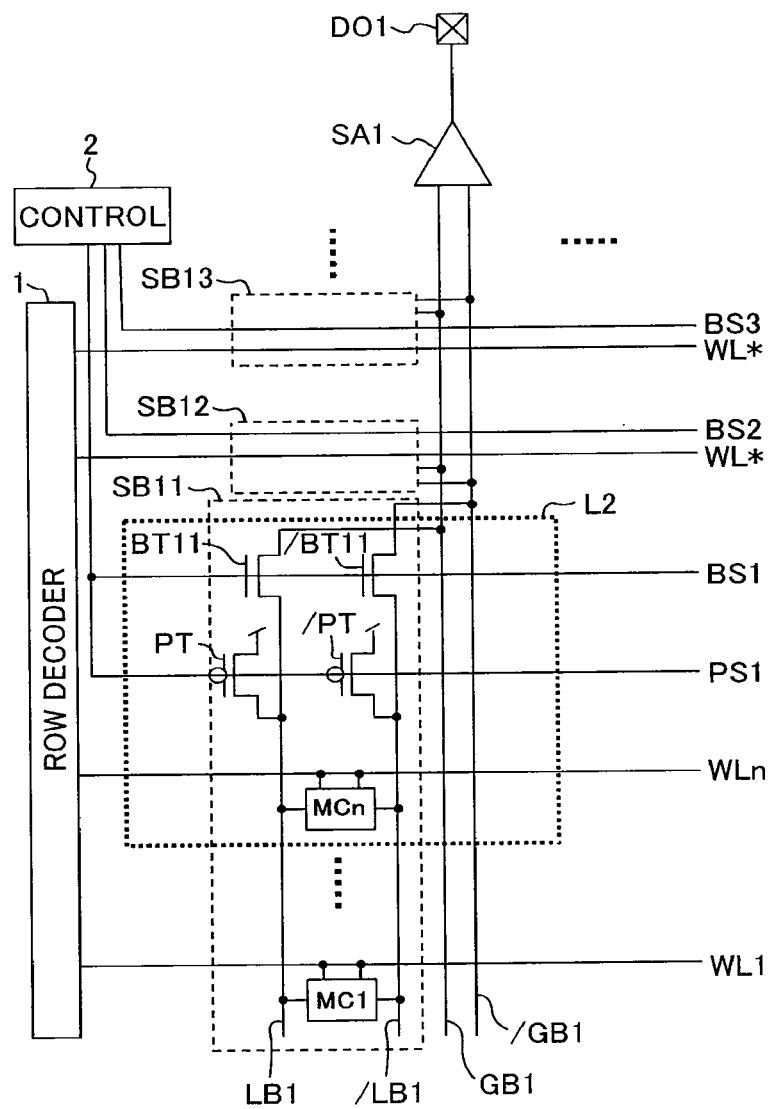
FIG. 17 is a circuit diagram showing a configuration of Embodiment 5.
Figure 18:
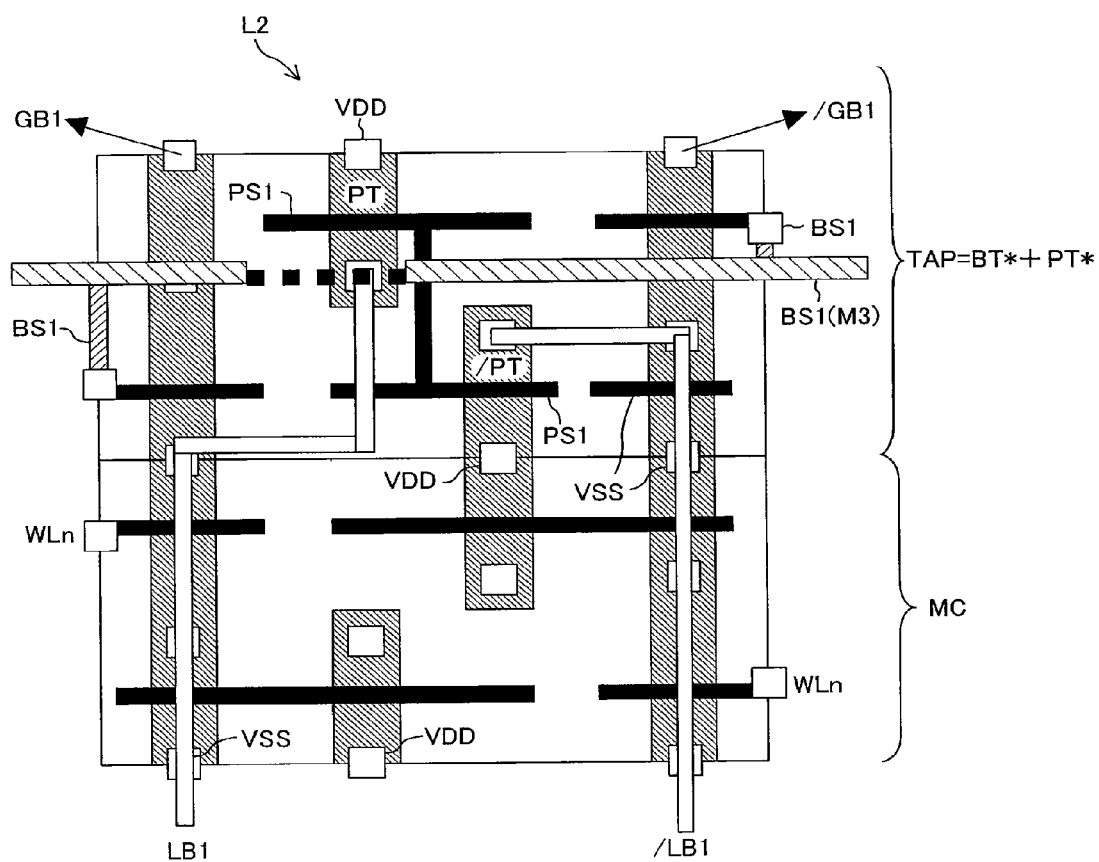
FIG. 18 is a layout diagram showing a configuration of Embodiment 5.

FIG. 17 is a circuit diagram of an SRAM. Since an SRAM has a differential bit line architecture, the sub-bit line is denoted as a pair LB1 and /LB1, and the main bit line as a pair GB1 and /GB1. Accordingly, the block selection transistor is denoted as a pair BT11 and /BT11, and a precharge transistor as a pair PT and /PT. FIG. 18 is a layout diagram of a cell portion. FIG. 18 shows the L2 section of FIG. 17.

Figure 19A:
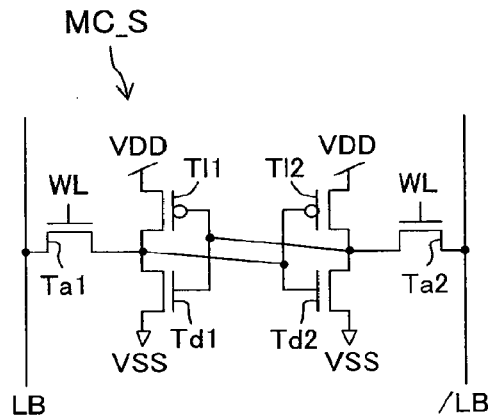
FIGS. 19A and 19B are a circuit diagram and a layout diagram showing a conventional SRAM configuration.

FIG. 19A shows a conventional SRAM memory cell. The conventional SRAM memory cell has a 6-transistor structure, wherein an inverter ring is formed by PMOS load transistors T11 and T12 and NMOS drive transistors Td1 and Td2, and NMOS access transistors Ta1 and Ta2 are used for external connection (with the bit line). The gates of the access transistors Ta1 and Ta2 are each connected to a word line.

Figure 19B:
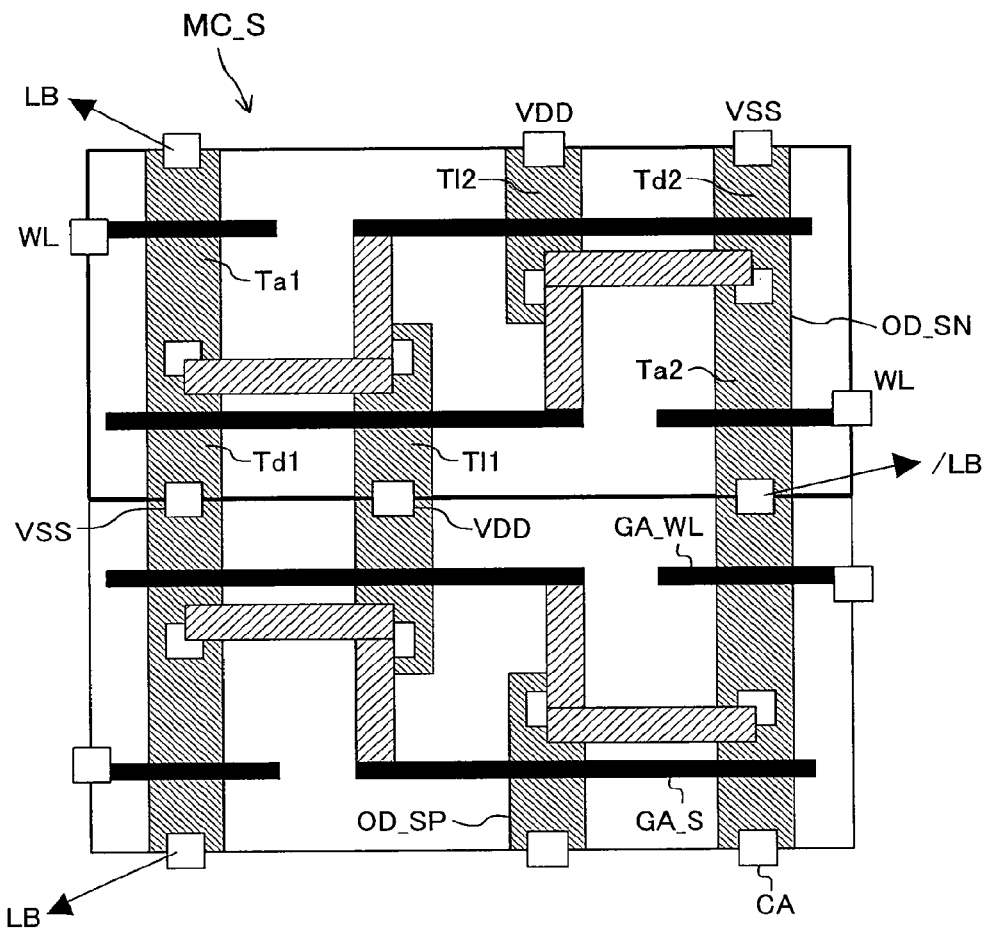

FIG. 19B is a layout diagram showing a configuration where two memory cells MC_S of FIG. 19A are provided in a vertically-mirrored arrangement. The configuration includes an NMOS activation region OD_SN, a PMOS activation region OD_SP, the gate GA_WL of the access transistor, and the gates GA_S of the transistors forming the inverter ring.

The transistors Td1 and T11 share a common gate GAS, the transistors T12 and Td2 share a common gate GA_S, the transistors Td1 and T11 share a common drain that is connected in the wiring layer with the gates of the transistors T12 and Td2, and the transistors T12 and Td2 share a common drain that is connected in the wiring layer to the gates of the transistors T11 and Td1.

In FIG. 18, MC denotes a normal memory cell region, and the TAP section is where a block selection transistor and a precharge transistor are formed by using SRAM memory cell patterns.

The transistors T11 and T12 in the activation region used in the SRAM memory cell are used as precharge transistors and the transistors Ta1 and Ta2 as block selection transistors.

The sub-bit lines LB1 and /LB1 are connected to the source/drain regions of the transistors Ta1 and Ta2, and the line BS1 is connected to the gates of the transistors Ta1 and Ta2 using the third-layer wire (M3). The gate GA_S is disconnected, the transistors Td1 and Td2 are removed, and the opposite side to the connection between the transistors Ta1 and Ta2 and the sub-bit lines LB1 and /LB1 is connected to the main bit lines GB1 and /GB1. The gates of the transistors Td1 and Td2 are connected together and to the line BS1, and the drain sections are connected to the sub-bit lines LB1 and /LB1, thereby providing a precharge function.

With the present configuration, OD patterns can be formed without changing the conventional SRAM memory patterns.

As described above, also in an SRAM, the block selection transistor section, etc., can be formed by using memory cell patterns. Thus, it is possible to maintain the area-reducing effect also with SRAMs.

The present invention addresses the problem of dummy patterns in a peripheral portion of a memory array, and is directed particularly to a semiconductor memory device of a hierarchical bit line architecture employing a bit line division structure, capable of providing a pattern uniformity across the memory array, whereby it is possible to achieve both a reduced variation in the transistor characteristics and a reduction in the total area. Thus, the configuration of the present invention significantly contributes to improving the performance of any semiconductor memory device employing such a configuration.

What is claimed is:

1. A semiconductor memory device, comprising:
    a plurality of first sub-memory arrays; and
    a main bit line connected to the plurality of first sub-memory arrays, wherein:
    each of the plurality of first sub-memory arrays includes:
        a pair of cell transistors that are adjacent along a first direction;
        a pair of memory cells, each of the pair of memory cells including only one of the pair of cell transistors;
        a sub-bit line connected to the pair of memory cells;
        a ground line; and
        a selection transistor connecting the sub-bit line to the main bit line, and having an active region,
    the active region of the selection transistor has a same shape and size as an active region of the pair of cell transistors,
    the pair of cell transistors are connected to the sub-bit line in parallel between the sub-bit line and the ground line,
    the main bit line and the sub-bit line run in the first direction,
    the ground line runs in a second direction perpendicular to the first direction,
    the sub-bit line overlaps, in planar view, the active region of the selection transistor and the active region of the pair of cell transistors, and
    the ground line overlaps, in planar view, the active region of the pair of cell transistors.

2. The semiconductor memory device of claim 1, wherein a gate of the selection transistor has a same shape and size as that of the pair of cell transistors.

3. The semiconductor memory device of claim 1, wherein:
    each of the plurality of first sub-memory arrays further includes a discharge transistor connected to the sub-bit line, and
    an active region of the discharge transistor has a same shape and size as that of the pair of cell transistors.

4. The semiconductor memory device of claim 1, wherein:
    the selection transistor comprises a plurality of active regions, and
    each of the plurality of active regions of the selection transistor has a same shape and size as that of the pair of cell transistors.

5. The semiconductor memory device of claim 1, further comprising a sense amplifier connected to the main bit line.

6. The semiconductor memory device of claim 5, further comprising:
    a second main bit line connected to the sense amplifier; and
    a plurality of second sub-memory arrays,
    wherein the second main bit line is connected to the plurality of second sub-memory arrays.

7. The semiconductor memory device of claim 1, further comprising a local sense amplifier connecting the selection transistor to the main bit line.

8. The semiconductor memory device of claim 7, wherein a transistor constituting the local sense amplifier has a same polarity as that of the pair of cell transistors.

9. The semiconductor memory device of claim 7, wherein at least two of the plurality of first sub-memory arrays share the local sense amplifier.

10. The semiconductor memory device of claim 7, wherein:
    the local sense amplifier comprises a plurality of active regions, and
    each of the plurality of active regions of the local sense amplifier has a same shape and size as that of the pair of cell transistors.

* * * * *